United States Patent
Yamauchi

[19]

[11] Patent Number: 5,859,546
[45] Date of Patent: Jan. 12, 1999

[54] CIRCUIT AND METHOD FOR SIGNAL PROCESSING

[75] Inventor: Hiroyuki Yamauchi, Osaka, Japan

[73] Assignee: Matsushita Electric Industrial Co., Ltd., Osaka, Japan

[21] Appl. No.: 744,807

[22] Filed: Nov. 6, 1996

[30] Foreign Application Priority Data

Nov. 8, 1995 [JP] Japan .................................. 7-289793

[51] Int. Cl.$^6$ .................... H03K 19/00; H03K 19/096
[52] U.S. Cl. ................ 326/93; 326/83; 326/98; 327/23
[58] Field of Search ............... 326/93, 95–98, 326/21, 23, 83; 327/22, 23

[56] References Cited

FOREIGN PATENT DOCUMENTS 4-298115  10/1992  Japan .
6-075768   3/1994  Japan .

*Primary Examiner*—Jon Santamauro
*Assistant Examiner*—Don Phu Le
*Attorney, Agent, or Firm*—McDermott, Will & Emery

[57] ABSTRACT

An exclusive OR circuit is provided which detects whether or not a preceding-stage logical output value and a subsequent-stage logical output value agree. When these logical output values are found to agree, a NAND circuit functions to cut off the supply of a clock signal to a first and second switch circuits and to a latch circuit. Accordingly, when there occur no data changes between clock signal cycles, in a switch circuit and a latch circuit both arranged between each stage of a pipeline, the charge/discharge of the capacitance of gate electrodes of transistors forming these circuits is prevented, thereby reducing power consumption.

14 Claims, 12 Drawing Sheets

CIRCUIT AND METHOD FOR SIGNAL PROCESSING

BACKGROUND OF THE INVENTION

1. Technical Field

The present invention relates to the improvement of signal processing. More specifically, the present invention pertains to signal processing circuits that operate in synchronization with a clock signal and signal processing methods for use in LSI (large-scale integrated) circuits such as microprocessors and signal processors. This invention is further directed to the reduction of electric power consumption in circuits such as switch circuits and latch circuits which operate in response to clock signals.

2. Background Art

In conventional signal processing circuits, particularly, in a very fast digital signal processing circuit of a semiconductor integrated circuit, a pipeline is formed by dividing a logic circuit or an arithmetic unit into an adequate number of stages and by placing a switch circuit and a latch circuit between each stage, to improve the throughput of signal processing.

Figure 9:
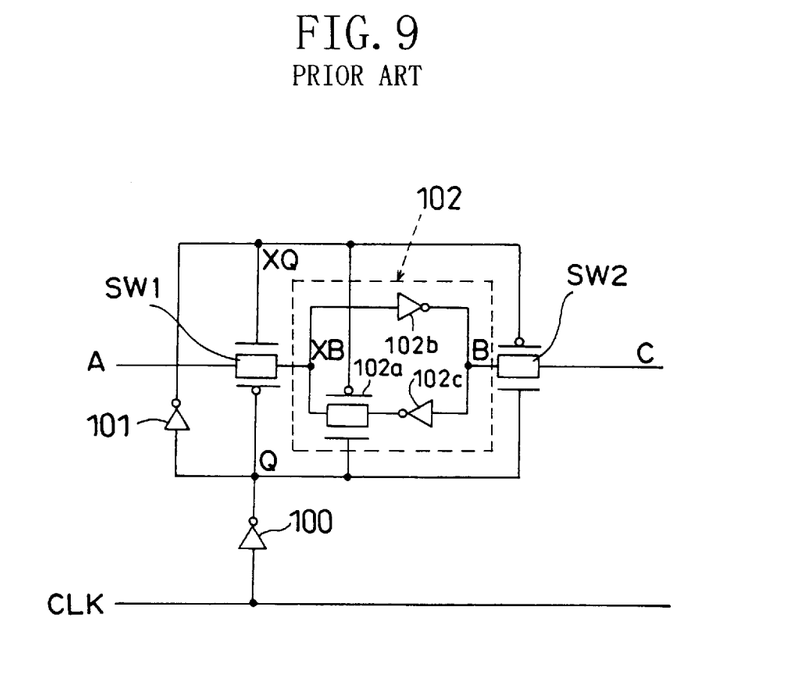
FIG. 9 shows a signal processing circuit in accordance with a prior art technique.

With reference to FIG. 9, one stage of such a pipeline structure is described. CLK indicates a clock signal. 100 is an inverter circuit which receives and inverts the clock signal CLK. 101 is another inverter circuit which receives and inverts the output Q of the inverter circuit 100.

Figure 10:
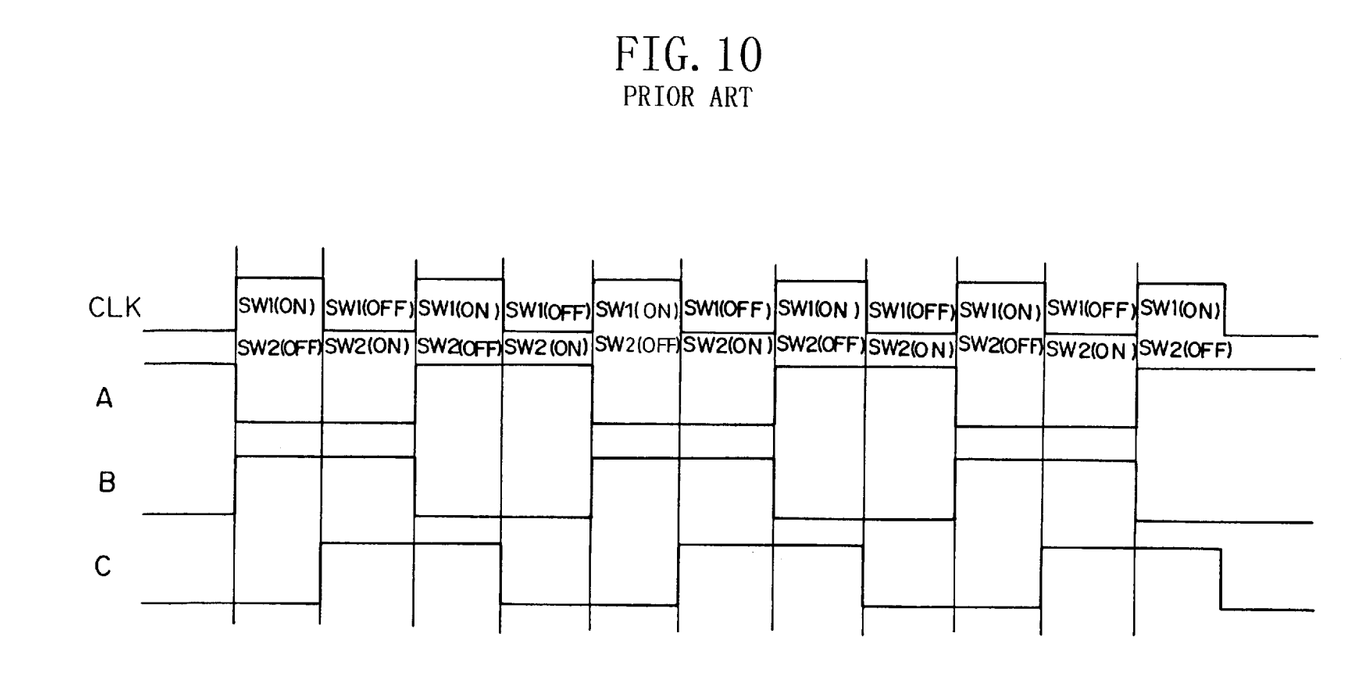
FIG. 10 is a timing diagram useful in understanding the operation of the conventional signal processing circuit.

SW1 is a first switch circuit. The first switch SW1 receives the output Q of the inverter circuit 101 and the output XQ of the inverter 101. On the rising edge of the clock signal CLK, the first switch SW1 turns on, as shown in FIG. 10. 102 is a latch circuit, comprised of a switch circuit 102a and two inverter circuits 102b and 102c, receives DATA A through the first switch SW1 when the first switch circuit SW1 turns on. This DATA A is latched by the latch circuit 102 when the first switch SW1 subsequently turns off. SW2 is a second switch circuit. The second switch circuit SW2 receives the output Q of the inverter circuit 100 and the output XQ of the inverter circuit 101. The second switch circuit SW2 turns on, on the falling edge of the clock signal CLK (FIG. 10) and outputs, to a subsequent stage, LATCH DATA B of the latch circuit 102 as DATA C.

This conventional signal processing circuit, however, has the following drawbacks. When no data changes occur between clock signal cycles, the transfer of data between pipelines is not essentially required. However, in the switch circuits SW1, SW2 and 102a and the inverter circuits 100 and 101, the gate electrode capacitance of transistors forming these circuits is charged or discharged every time the clock signal CLK rises or falls. The gate electrode capacitance is charged or discharged even when LATCH DATA XB of the latch circuit 102 is identical with the next INPUT DATA A, which increases the power consumption by a proportional amount to such charge/discharge. In other words, the switch circuits SW1, SW2 and 102a and the inverter circuits 100 and 101 operate, regardless of the contents of transfer data, with their gate electrode capacitance repeatedly charged or discharged in synchronization with the system clock signal CLK. As a result of such charge/discharge, extra electric power is wasted. Especially, in the idling state, that is, when the clock signal is still supplied although the arithmetic unit is in the non-operation mode, further extra electric power is wasted.

SUMMARY OF THE INVENTION

Bearing in mind the above-described problems, the present invention was made. It is therefore an object of the present invention to provide an improved signal processing circuit and method so that the supply of clock signals can be cut off when there occurs a change in logical output such as arithmetic processing data.

In accordance with the present invention, detection of whether or not latch data of a circuit with a latch function and the next input data agree, is performed. The clock signal supply is cut off or allowed according to the detection result.

The present invention provides an improved signal processing circuit. This signal processing circuit comprises a switch circuit for allowing or cutting off the transfer of a logical output and a circuit capable of latching the logical output, the signal processing circuit further comprising:

control means for controlling the switch circuit and the latch circuit according to the AND of a clock signal and a comparison result signal indicative of a result obtained by making a comparison between a previous logical output value and a current logical output value.

In the signal processing circuit of the present invention, (A) when a logical output value of a preceding stage and a logical output value of a subsequent stage disagree, the control means supplies a clock signal to the switch and latch circuits and (B) when the logical output values agree, the control means cuts off the supply of the clock signal to the switch and latch circuits.

As a result of such arrangement, when previous data and current data agree, the clock signal supply to the switch and latch circuits is cut off and the previous state is held, thereby preventing these circuits from repeatedly being charged or discharged for all time at a cycle twice the clock signal cycle (i.e., both on the rising edge and on the falling edge). This achieves a reduction in the power consumption.

The object and other features of the present invention will be better understood from the following description when considered with the accompanying drawing FIGS.

BRIEF DESCRIPTION OF THE DRAWINGS

Preferred embodiments of the present invention are shown in the following drawing FIGS. in which.

DETAILED DESCRIPTION OF THE INVENTION

Preferred embodiments of the present invention are illustrated below with reference to the accompanying drawings.

Figure 1:
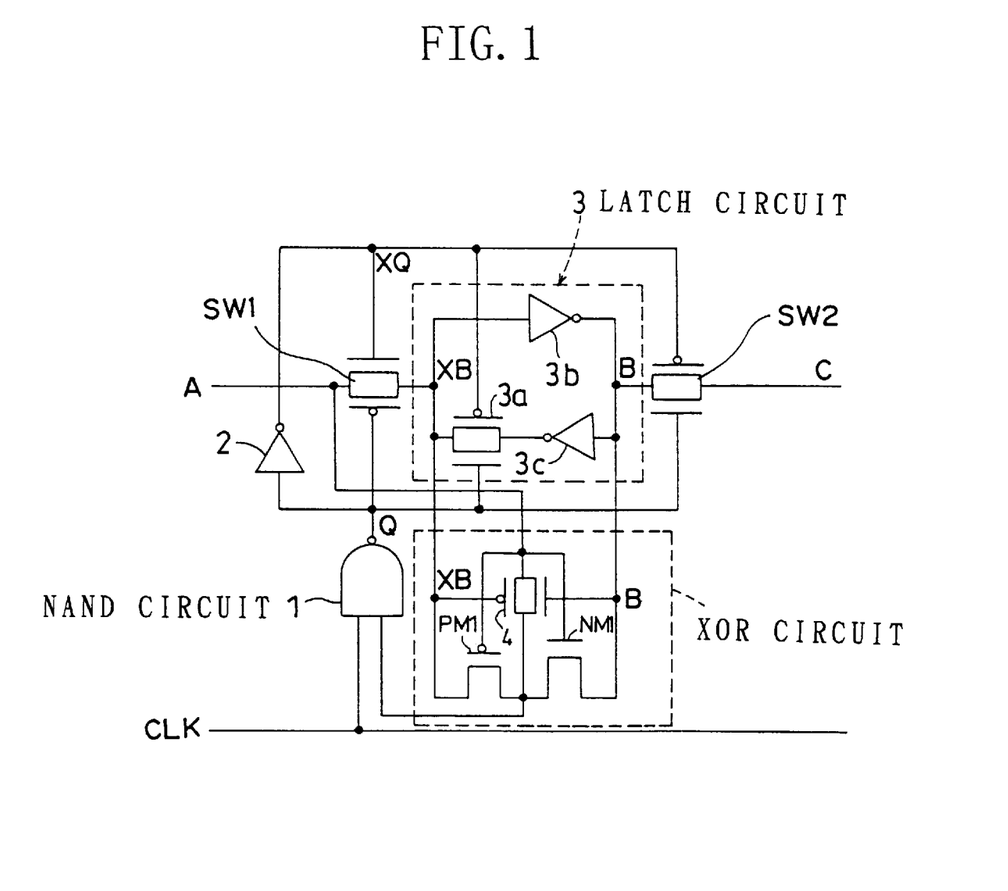
FIG. 1 shows a signal processing circuit in accordance with a first embodiment of the present invention.

FIG. 1 illustrates a signal processing circuit in accordance with a first embodiment of the present invention. Here, a logic circuit or an arithmetic unit is divided into a plurality of stages to form a pipeline structure, and a circuit configuration between stages is shown in FIG. 1.

CLK indicates a clock signal. 1 is a NAND circuit (a clock signal distribution circuit). The NAND circuit 1 receives and distributes clock signals CLK. 2 is an inverter circuit. The inverter circuit 2 receives and inverts the output Q of the NAND circuit 1.

SW1 is a first switch circuit. The first switch circuit SW1 receives the output Q of the NAND circuit 1 and the output XQ of the inverter circuit 2. On the falling edge of the output Q, the first switch SW1 turns on. 3 is a latch circuit. The latch circuit 3, comprised of a switch circuit 3a and two inverter circuits 3b and 3c, receives DATA A through the first switch circuit SW1 when the first switch circuit SW1 is in the ON state and latches the received data when the first switch SW1 subsequently turns off. In the present embodiment, the latch circuit 3 has a latch function only. Instead of using the latch circuit 3, circuits with functions other than latch functions may be employed. The present invention finds applications in circuits that have at least a latch function.

SW2 is a second switch circuit. The second switch circuit SW2 receives the output Q of the NAND circuit 1 and the output XQ of the inverter circuit 2. On the rising edge of the output Q, the second switch circuit SW2 turns on and outputs LATCH DATA B of the latch circuit 3 to a subsequent stage as DATA C. The first switch circuit SW1 is a circuit for the inversion write of DATA A with high drive power. The second switch circuit SW2 is a circuit with high drive power, since the second switch circuit SW2 is required to drive a signal line through which DATA C is transmitted.

The present invention is characterized in that an exclusive OR circuit XOR (a comparison circuit) is provided. The exclusive OR circuit XOR is coupled to the nodes of SIGNALS XB and B on both sides of the latch circuit 3 (a logical output value of the subsequent stage) as well as to the node of preceding-stage SIGNAL A (a logical output value of the preceding stage). The exclusive OR circuit XOR includes a switch circuit 4, a PMOS transistor PM1 and an NMOS transistor NM1. The exclusive OR circuit XOR performs arithmetic detection of whether or not LATCH DATA XB agrees with INPUT DATA A, thereafter providing the detection result. More specifically, when LATCH DATA XB and INPUT DATA A are identical in logical voltage with each other, the output of the exclusive OR circuit XOR is low (LOW). On the other hand, when LATCH DATA XB and INPUT DATA A are different from each other in logical voltage, the output of the exclusive OR circuit XOR is high (HIGH).

It is set in order that the total of the channel width of the PMOS transistor PM1 and the channel width of the NMOS transistor NM1 is less than the channel width of the transistor forming the second switch circuit SW2.

The NAND circuit 1 performs gating on the clock signal CLK. The output of the exclusive OR circuit XOR is fed back to the NAND circuit 1.

The exclusive OR circuit XOR and the NAND circuit 1 together form a control means for controlling the first and second switch circuits SW1 and SW2 and the latch circuit 3. More specifically, the output Q is changed to HIGH or to LOW by the AND of (A) a comparison result signal indicative of a result of the arithmetic comparison made between LATCH DATA XB and INPUT DATA A to detect whether or not they agree and (B) a clock signal CLK. The first and second switch circuits SW1, SW2 and the latch circuit 3 are all controlled by the changed output Q. The total channel width of all transistors of the control means, which comprises the exclusive OR circuit (XOR) and the NAND circuit 1, is set to be less than the total channel width of all transistors contained in the first and second switch circuits SW1 and SW2.

In the present embodiment, the supply of the clock signal CLK is controlled. In other words, when LATCH DATA XB and INPUT DATA A have the same logical voltage, the output of the exclusive OR circuit XOR becomes LOW. As a result, the output Q of the NAND circuit 1 is fixed at the level of HIGH, and the supply of the clock signal CLK is cut off. A situation, in which the latch circuit 3 latches LATCH DATA XB, regardless of the clock signal change and DATA B (i.e., an inversion of LATCH DATA XB) is fed through the second switch circuit SW2 to the next stage, is maintained.

The output Q of the NAND circuit 1 is fixed at the level of HIGH, regardless of the clock signal change. Therefore, the charge/discharge of the capacitance of each of the gate electrodes of the first and second switch circuits SW1 and SW2 and the switch circuit 3a of the latch circuit 3 can be avoided. This achieves a reduction in electric power consumption.

Figure 2:
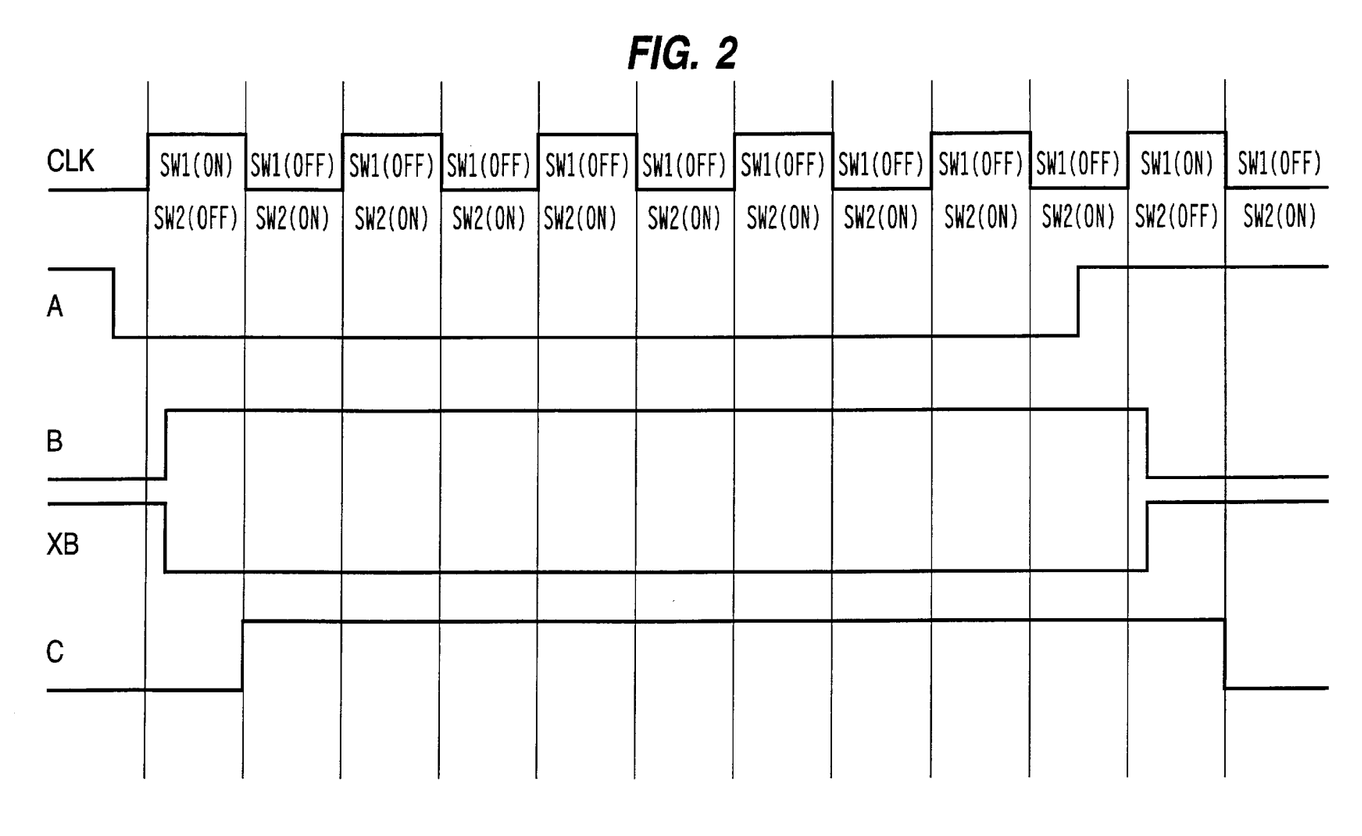
FIG. 2 is a timing diagram useful in understanding the operation of the signal processing circuit of the first embodiment.

FIG. 2 is a timing diagram illustrating the operation of the signal processing circuit of the present embodiment. As can be seen from the timing diagram, when INPUT DATA A makes no changes, the first and second switch circuits SW1 and SW2 maintain their respective operation states and none of the nodes of DATA B, DATA XB and DATA C make a change.

Reductions in the power consumption brought by the present signal processing circuit are described. In the signal processing circuit of the present embodiment, with the addition of the exclusive OR circuit XOR, the load capacitance at the node of SIGNAL A of the preceding stage increases. An increase in the load capacitance is the total of the capacitance of the switch circuit 4, the capacitance of the PMOS transistor PM1 and the capacitance of the NMOS transistor NM1. A load capacitance that the exclusive OR circuit XOR drives is the input capacitance of the NAND circuit 1 and, therefore, it is supposed that C=10E–15[F] where C is the total gate capacitance of two MOS transistors (not shown) forming the NAND circuit 1.

On the other hand, in the conventional circuit of FIG. 9, a load capacitance that is driven due to a change in the clock signal CLK is the total capacitance of the first and second switch circuits SW1 and SW2 and the switch circuit 102a of the latch circuit 102. Additionally, a load capacitance that the second switch circuit SW2 drives is the wire capacitance CW of a wire through which DATA C is transmitted and the wire capacitance CW is given by:

$$CW = 10E-13[F]$$

The signal processing circuit of the present embodiment shown in FIG. 1 is compared with the conventional signal processing circuit shown in FIG. 9. The ratio of CW (i.e., the wire capacitance to be driven by the second switch circuit SW2 in the conventional signal processing circuit) and C (i.e., the load capacitance to be driven by the exclusive OR circuit XOR of the present embodiment) is 100:1. Suppose here that the second switch circuit SW2 of the conventional circuit and the exclusive OR circuit XOR of the present embodiment require the same drive time (the delay time). The transistor current value ratio at drive time is also 100:1.

The transistor current value is proportional to the transistor channel width. Therefore, the ratio of (A) the channel width of the second switch circuit SW2 of the conventional signal processing circuit and (B) the total channel width of the two MOS transistors PM1 and NM1 forming the exclusive OR circuit XOR of the present signal processing circuit, is 100:1. Further, the transistor capacitance is proportional to the transistor channel width. Therefore, the ratio of (A) the capacitance of the second switch circuit SW2 of the conventional signal processing circuit and (B) the total capacitance of the two MOS transistors PM1 and NM1 forming the exclusive OR circuit XOR of the present signal processing circuit, is 100:1. Although there is produced an about 1% increase in capacitance due to the addition of the exclusive OR circuit XOR in the signal processing circuit of the present embodiment, the charge and discharge of the remaining 99% capacitance (the total capacitance of the first and second switch circuits SW1, SW2 and the switch circuit 3a of the latch circuit 3) can be prevented. A further reduction in power consumption is achieved by such charge/discharge prevention.

Figure 12:
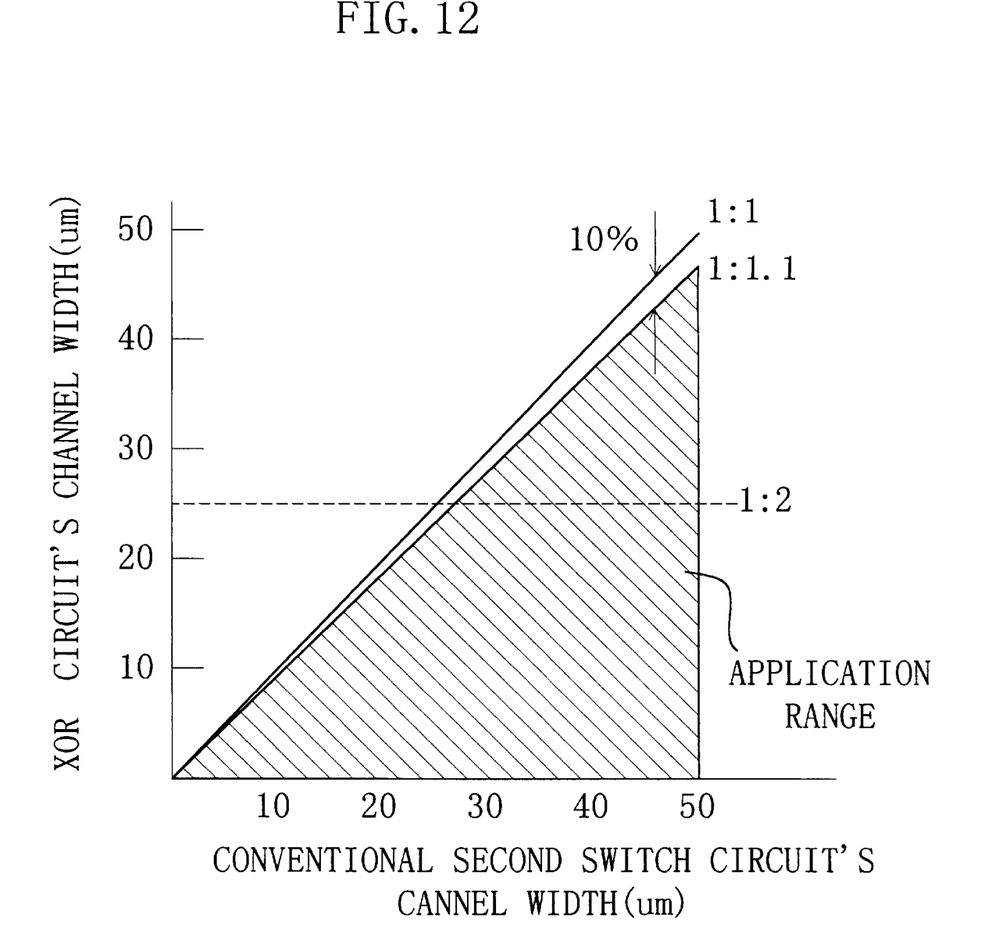
FIG. 12 is a diagram useful in understanding the setting of the total channel width of transistors forming an exclusive OR circuit of the signal processing circuit of the first embodiment for the reduction of power consumption.

For example, if the total channel width of the transistors forming the exclusive OR circuit XOR is set to be below ½ of the channel width of the transistor forming the second switch circuit SW2 of the conventional signal processing circuit, this achieves a 50% or more reduction in power consumption. It is preferred that the total channel width of the transistors forming the exclusive OR circuit XOR is less than the total channel width of the transistors of the switch circuit SW2 of the conventional signal processing circuit by 10% or more, to effectively reduce the power consumption of the signal processing circuit of the present embodiment (FIG. 12).

SECOND EMBODIMENT

Figure 3:
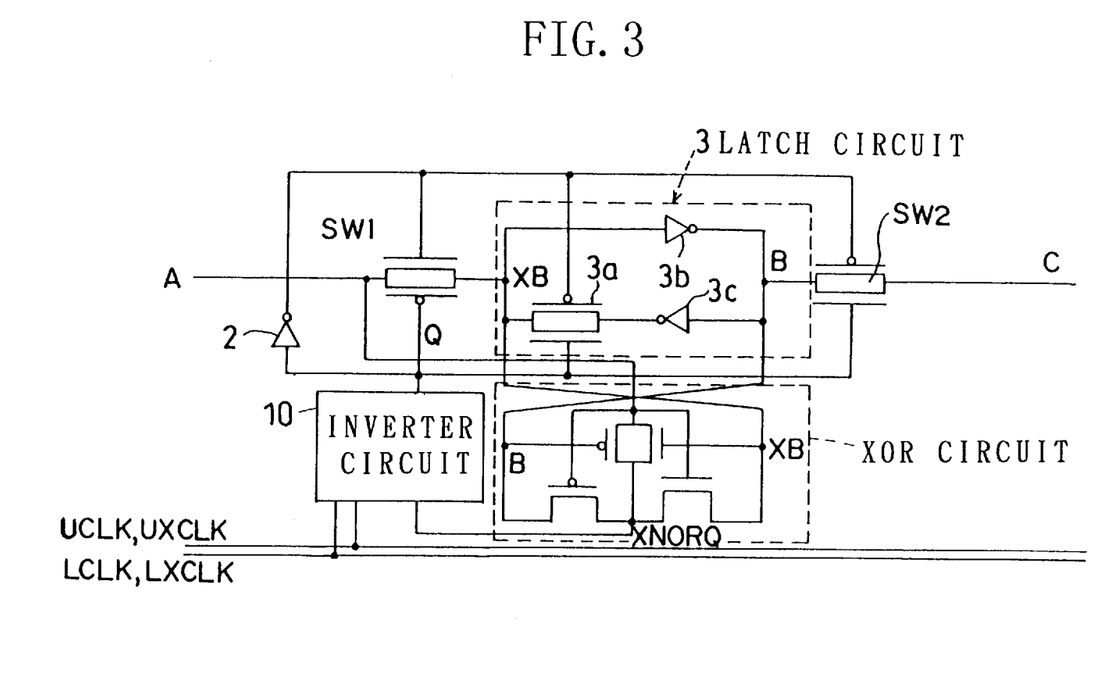
FIG. 3 shows a signal processing circuit in accordance with a second embodiment of the present invention.

Referring now to FIG. 3, a second embodiment of the present invention is explained.

The present embodiment is characterized by the configuration of a clock signal distribution circuit where a clock signal is a differential signal comprising two signals which make respective potential transitions in opposite directions. The differential signal is composed of a first differential clock signal and a second differential clock signal.

The signal processing circuit of FIG. 3 is identical in configuration with the signal processing circuit of FIG. 1, except for the configuration of the clock signal distribution circuit and the configuration of the comparison circuit. Therefore, the same reference numerals are used to indicate like elements and they are not described.

Figure 11:
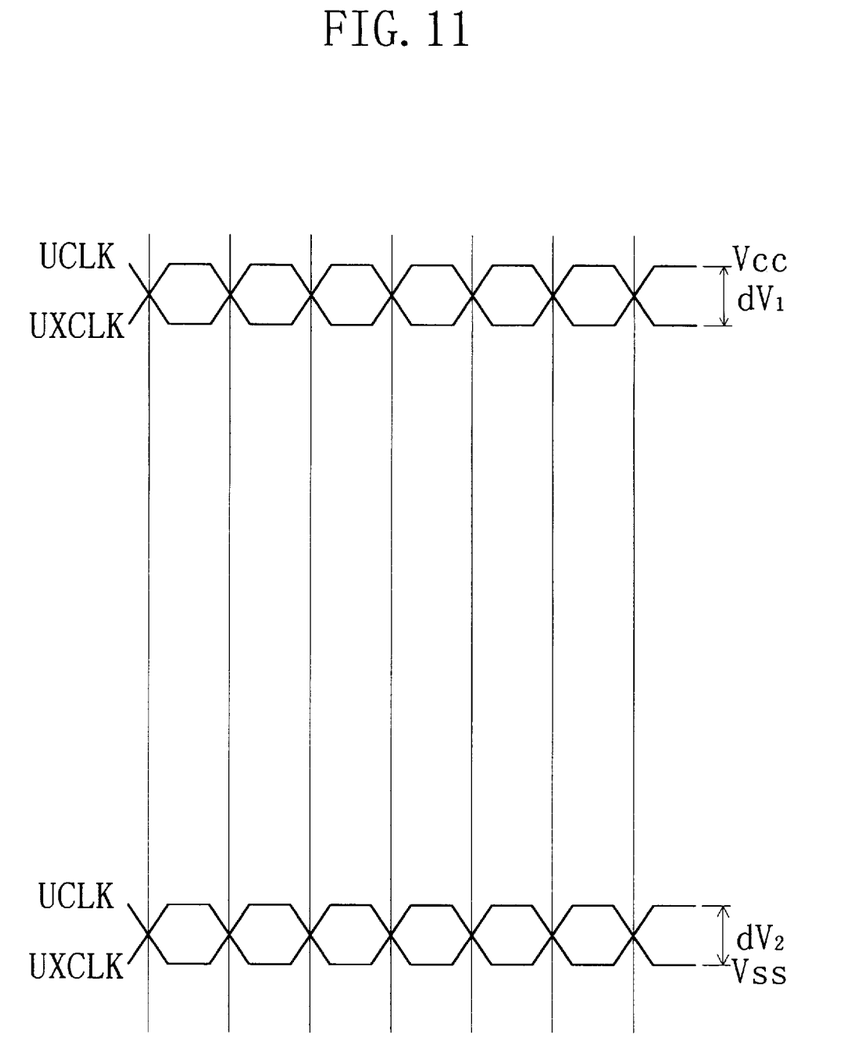
FIG. 11 is a waveform diagram illustrating a first and a second differential signal in the second embodiment.

With reference to FIG. 3, UCLK/UXCLK is a first differential clock signal. As shown in FIG. 11, with a power supply potential Vcc as a reference, the first differential clock signal is formed of a combination of two signals, one of which is at Vcc and the other of which is at a potential lower than Vcc by a micro-potential dV1. LCLK/LXCLK is a second differential clock signal in synchronization with the first differential clock signal. As shown in FIG. 11, with a ground potential Vss as a reference, the second differential clock signal is formed of a combination of two signals, one of which is at Vss and the other of which is at a potential higher than Vss by a micro-potential dV2.

XNOR indicates an exclusive NOR circuit (a comparison circuit). The exclusive NOR circuit XNOR is coupled to the nodes of SIGNALS XB and B on both sides of the latch circuit 3 (a logical output value of the subsequent stage) as well as to the node of SIGNAL A of the preceding stage (a logical output value of the preceding stage). The exclusive NOR circuit XNOR arithmetically detects whether LATCH DATA XB corresponds to INPUT DATA A and provides the detection result (XNORQ). 10 is an inverter circuit (a clock signal distribution circuit). The internal configuration of the inverter circuit 10 is described later. The operation of the inverter circuit 10 is outlined. The inverter circuit 10 receives the first and second differential clock signals and the output XNORQ of the exclusive NOR circuit XNOR and provides a clock signal Q with a CMOS-level full amplitude (the potential difference between the power supply potential Vcc and the ground potential Vss).

Figure 4:
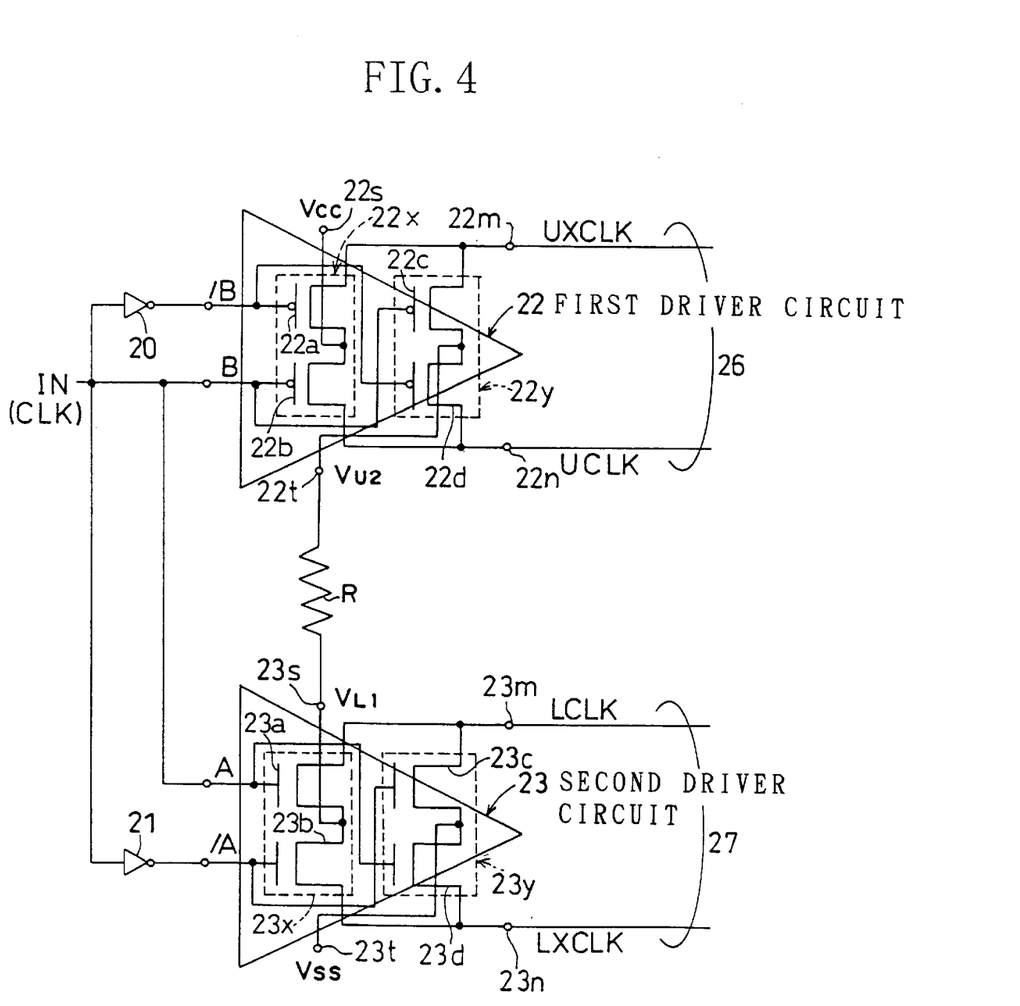
FIG. 4 shows a first and a second driver circuit of the signal processing circuit of the second embodiment.

The first differential clock signal UCLK/UXCLK and the second differential clock signal LCLK/LXCLK are generated by the first and second driver circuits 22 and 23 of FIG. 4, respectively. The first and second driver circuits 22 and 23 are connected together in series by a resistor R placed therebetween. This serial circuit is connected between the power supply voltage Vcc and the ground potential Vss.

The first driver circuit 22 includes a pair of output terminals 22m and 22n coupled to a differential wire pair 26 for the first differential clock signal and a first and second push-pull circuits 22x and 22y coupled to the output terminal pair. The first push-pull circuit 22x is connected to a power supply terminal 22s coupled to a power supply the voltage of which is Vcc. The first push-pull circuit 22x has two PMOS transistors 22a and 22b. The clock signal CLK and its inverted signal, which is produced by inverting the clock signal CLK by means of the inverter circuit 20, are applied to the gates of the PMOS transistors 22a and 22b, as signals B and /B. In the push-pull circuit 22x, when the signal B is LOW, the PMOS transistor 22b turns on and the power supply terminal 22s is coupled to the output terminal 22n. On the other hand, when the signal /B is LOW, the PMOS transistor 22a turns on and the power supply terminal 22s is coupled to the output terminal 22m. The second push-pull circuit 22y is connected to a power supply terminal 22t the voltage of which is VU2. The second push-pull circuit 22y has two NMOS transistors 22c and 22d. The signals B and /B are applied to the gates of the NMOS transistors 22c and 22d. In the second push-pull circuit 22y, when the signal B is LOW, the NMOS transistor 22c turns on and the power supply terminal 22t is connected to the output terminal 22m. On the other hand, when the signal /B is LOW, the NMOS transistor 22d turns on and the power supply terminal 22t is connected to the output terminal 22n.

The second driver circuit 23 has a pair of output terminals 23m and 23n connected to a differential wire pair 27 for the second differential clock signal and a first and a second push-pull circuits 23x and 23y connected to the output terminal pair. Unlike the first driver circuit 22, each push-pull circuit 23x, 23y has NMOS transistors 23a–23d. The signals B and /B are applied to the gates of the NMOS transistors 23a–23d. The first push-pull circuit 23x is connected to a power supply terminal 23s having a voltage of VL1. On the other hand, the second push-pull circuit 23y is connected to a ground terminal 23t. The operation of the second driver circuit 23 is identical with the operation of the first driver circuit 22.

The potential VU2 is a first set voltage that is lower than the power supply voltage Vcc by a microvoltage dV1, while the potential VL1 is a second set voltage that is higher than the ground voltage Vss by a microvoltage dV2. These microvoltages dV1 and dV2 are determined by means of resistive potential division of the resistance of transistors forming the driver circuits 22 and 23 and the resistance R. Each of the microvoltages dV1 and dV2 decrease as the insertion resistance R increases.

Figure 5:
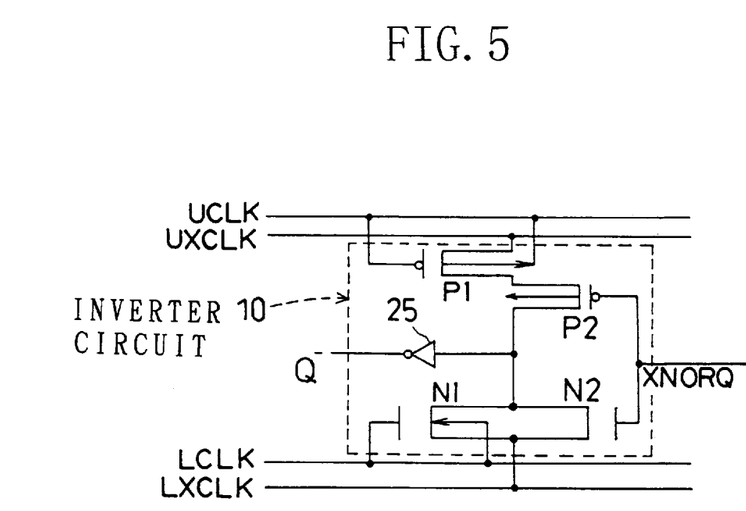
FIG. 5 shows an inverter circuit (a clock signal distribution circuit)

FIG. 5 shows the configuration of the inverter circuit (clock signal distribution circuit) 10.

The inverter circuit 10 of FIG. 5 has a CMOS inverter circuit. This CMOS inverter circuit is composed of a first PMOS transistor P1 and a first NMOS transistor N1. The first differential clock signal UCLK/UXCLK is fed to the gate and source electrodes of the PMOS transistor P1. The second differential clock signal LCLK/LXCLK is fed to the gate and source electrodes of the NMOS transistor N1. The drain electrodes of the transistors P1 and N1 are connected together in common. A connection between these drain electrodes, which acts as an output terminal, is coupled to another inverter circuit 25. The output of the inverter circuit 25 becomes the output Q of the inverter circuit 10.

The inverter circuit 10 further has a second PMOS transistor P2 and a second NMOS transistor N2. The source and drain electrodes of the second PMOS transistor P2 are coupled to the drain electrode of the first PMOS transistor P1 and to the output terminal, respectively. The source and drain electrodes of the second NMOS transistor N2 are coupled to the source and drain electrodes of the first NMOS transistor N1, respectively. The output XNORQ of the exclusive NOR circuit XNOR is applied to the gate electrodes of the MOS transistors P2 and N2.

Accordingly, the inverter circuit 10 of the present embodiment operates as follows. When transfer data change in sync with the differential clock signal, the output XNORQ of the exclusive NOR circuit XNOR is fixed at the level of LOW, and the second PMOS transistor P2 of the inverter circuit 10 constantly turns on. As a result, the function of the CMOS inverter circuit, made up of the MOS transistors P1 and N1, is achieved.

On the other hand, when transfer data make no change in sync with the differential clock signal, the output XNORQ of the exclusive NOR circuit XNOR is fixed at the level of HIGH, and the second NMOS transistor N2 of the inverter circuit 10 constantly turns off. As a result, the output Q of the inverter circuit 10 is fixed at the level of HIGH and the supply of the differential clock signal is cut off. Accordingly, as in the first embodiment, the charge/discharge of the capacitance of each of the gate electrodes of the first and second switch circuits SW1, SW2 and the switch circuit 3a of the latch circuit 3 is prevented, therefore making it possible to achieve a reduction in the power consumption.

In the present embodiment, the differential clock signal is applied to the gate and source electrodes of the MOS transistors P1 and N1 of the inverter circuit 10 and, when the differential clock signal makes a change in the potential, the gate and source electrode potentials make their respective transitions in opposite directions. Therefore, even when the differential clock signal has an amplitude voltage that is a microvoltage, it is guaranteed that the MOS transistors P1 and N1 are cut off. Additionally, when the MOS transistors P1 and N1 turn off, negative voltage is applied between the gate and source electrodes, in other words the differential clock signal potential difference is reverse-biased. Therefore, even when the threshold voltage of the MOS transistors P1 and N1 is low, it is guaranteed that these transistors are cut off. By setting the threshold voltage of the MOS transistors P1 and N1 at low level, (Vg–Vs–Vt), i.e., the voltage based on which current necessary for driving the MOS transistors P1 and N1 is determined, increases, where Vg is the gate electrode voltage, Vs is the source electrode voltage and Vt is the threshold voltage. This achieves a reduction in the delay time.

Figure 6:
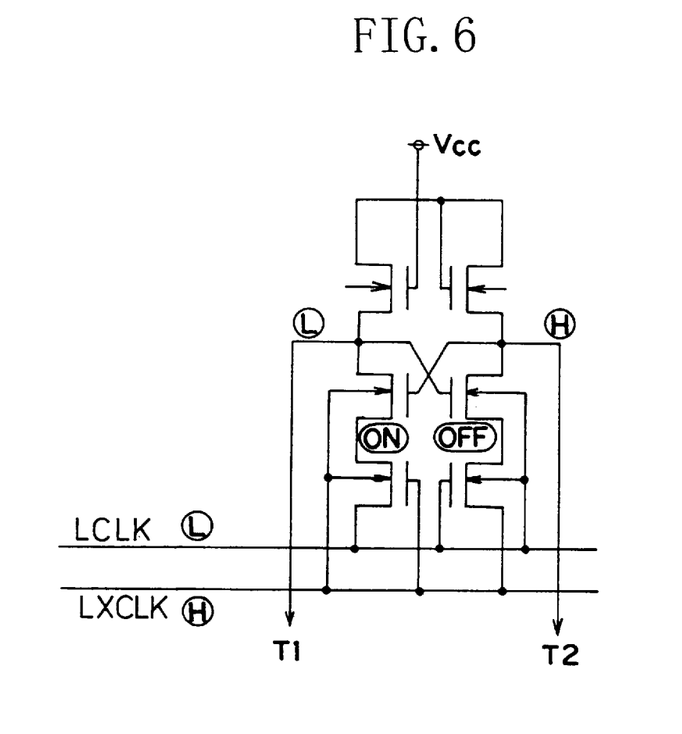
FIG. 6 shows a clock signal receiver circuit.
Figure 7:
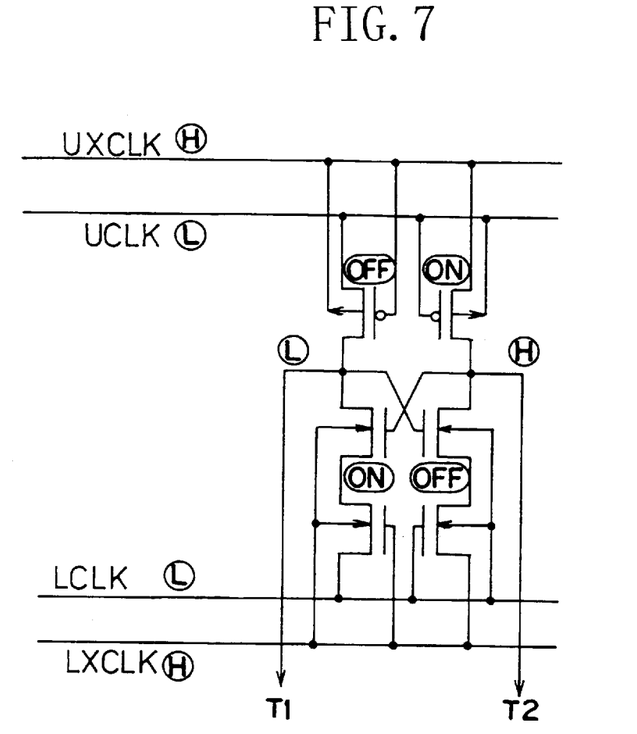
FIG. 7 shows another clock signal receiver circuit.
Figure 8:
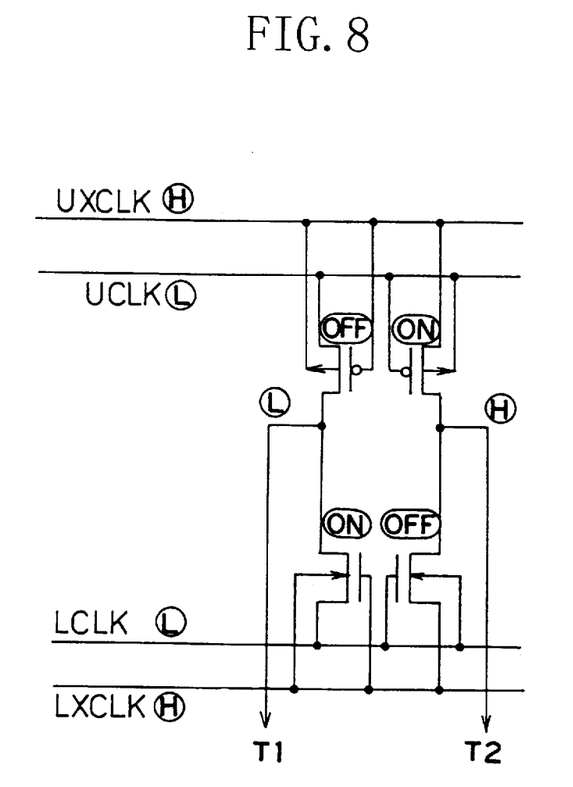
FIG. 8 shows still another clock signal receiver circuit.

FIGS. 6, 7 and 8 show receiver circuits that statically receive the foregoing differential clock signal. FIG. 6 shows a receiver circuit that receives only the second differential clock signal and provides a differential signal T1/T2. FIGS. 7 and 8 show receiver circuits each of which receives the first and second differential clock signals and provides the differential signal T1/T2. These receiver circuits may be used in gating-circuits for differential clock signals with a small amplitude.

The invention claimed is:

1. A signal processing circuit comprising a switch circuit for allowing or cutting off the transfer of a logical output and a circuit capable of latching said logical output, said signal processing circuit further comprising:

control means for controlling said switch circuit and said latch circuit according to the AND of a clock signal and a comparison result signal indicative of a result obtained by making a comparison between a previous logical output value and a current logical output value.

2. A signal processing circuit according to claim 1 wherein said signal processing circuit has a plurality of stages resulting from dividing a logic circuit or an arithmetic unit in a process sequence direction thereof and wherein said switch circuit, said latch circuit and said control means are arranged between stages of said plurality of stages, to pipeline-process signals at said plurality of stages.

3. A signal processing circuit according to claim 2, said switch circuit and said latch circuit including:

a first switch circuit;

a circuit which receives a logical output from said first switch circuit and latches said received logical output; and a second switch circuit which receives said logical output from said latch circuit and transmits said received logical output to a subsequent stage.

4. A signal processing circuit according to claim 1 or claim 2 wherein each of said switch circuit and said control means is formed of transistors and wherein it is set such that the total channel width of all of said transistors of said control means is less than that of all of said transistors of said switch circuit.

5. A signal processing circuit according to claim 2 wherein, when a logical output value of a preceding stage and a logical output value of a subsequent stage disagree, said control means supplies a clock signal to said switch and latch circuits of each of said plurality of stages and wherein, when said logical output values agree, said control means cuts off the supply of said clock signal to said switch and latch circuits of each of said plurality of stages.

6. A signal processing circuit according to claim 3, said control means including:

a comparison circuit for detecting whether or not a logical output value of a preceding stage and a logical output value of a subsequent stage agree; and a clock signal distribution circuit which receives a clock signal and an output of said comparison circuit and which allows or cuts off the supply of said received clock signal to said switch and latch circuits according to said output of said comparison circuit.

7. A signal processing circuit according to claim 6 wherein each of said second switch circuit and said comparison circuit is formed of transistors and wherein it is set such that the total channel width of said transistors of said comparison circuit is less than that of said transistors of said second switch circuit.

8. A signal processing circuit according to claim 6 or claim 7 wherein said comparison circuit is formed by an exclusive OR circuit.

9. A signal processing circuit according to claim 6 or claim 7 wherein said comparison circuit is formed by an exclusive NOR circuit.

10. A signal processing circuit according to claim 6 or claim 7 wherein said clock signal distribution circuit is formed by a NAND circuit.

11. A signal processing circuit according to claim 1, claim 2 or claim 6 wherein said clock signal is formed of a first differential clock signal and a second differential clock signal.

12. A signal processing circuit according to claim 11 wherein said first differential clock signal is a differential clock signal with a micro-amplitude voltage based on a power supply potential and wherein said second differential clock signal is in synchronization with said first differential clock signal and is a differential clock signal with a micro-amplitude voltage based on a ground potential.

13. A signal processing circuit according to claim 12, said clock signal distribution circuit including:

a CMOS inverter circuit which is formed of a first PMOS transistor and a first NMOS transistor, drain electrodes of said first PMOS transistor and said first NMOS transistor being connected together;

a second PMOS transistor; and a second NMOS transistor;

wherein:

(a) said CMOS inverter circuit has an output terminal which is a connection between said drain electrodes of said first PMOS transistor and said first NMOS transistor;

(b) said first differential clock signal is applied to gate and source electrodes of said first PMOS transistor while said second differential clock signal is applied to gate and source electrodes of said first NMOS transistor;

(c) said second PMOS transistor is arranged between said drain electrode of said first PMOS transistor and the output terminal of said CMOS inverter circuit;

(d) source and drain electrodes of said second NMOS transistor are connected in parallel with said source and drain electrodes of said first NMOS transistor, respectively; and (e) the output of said comparison circuit formed of an exclusive NOR circuit is fed to gates of said second PMOS transistor and said second NMOS transistor.

14. A signal processing method for use in a circuit comprising a switch circuit for allowing or cutting off the transfer of a logical output and a circuit capable of latching a logical output, said signal processing method comprising the steps of:

making a comparison between a previous logical output value and a current logical output value;

supplying a clock signal to said switch circuit and to said latch circuit when said logical output values disagree;

cutting off the supply of said clock signal to said switch circuit and to said latch circuit when said logical output values agree.

* * * * *